United States Patent [19]

Kinugasa et al.

[11] Patent Number: 5,742,539
[45] Date of Patent: Apr. 21, 1998

[54] INTEGRATED CIRCUIT FOR CONTENT ADDRESSABLE MEMORY

[75] Inventors: Hajime Kinugasa; Naoki Kanazawa, both of Chiba, Japan

[73] Assignee: Kawasaki Steel Corporation, Kobe, Japan

[21] Appl. No.: 767,294

[22] Filed: Dec. 16, 1996

Related U.S. Application Data

[63] Continuation of Ser. No. 555,840, Nov. 13, 1995, abandoned.

[30] Foreign Application Priority Data

Nov. 16, 1994 [JP] Japan ................................ 6-281828

[51] Int. Cl.$^6$ .................................................. G11C 15/00
[52] U.S. Cl. .................... 365/49; 365/51; 365/63; 365/230.03; 365/230.06; 395/435
[58] Field of Search .................... 365/230.06, 230.03, 365/49, 51, 63; 395/435

[56] References Cited

U.S. PATENT DOCUMENTS 4,975,873 12/1990 Nakabayashi et al. .............. 365/49
5,231,603 7/1993 Luhramann ........................... 365/49
5,394,353 2/1995 Nusinou et al. ...................... 365/49
5,406,508 4/1995 Hayashibara ......................... 365/49

FOREIGN PATENT DOCUMENTS

A-6-12882  1/1994  Japan.

*Primary Examiner*—Do Hyun Yoo
*Attorney, Agent, or Firm*—Oliff & Berridge, PLC

[57] ABSTRACT

A semiconductor integrated circuit includes a memory unit that receives data that is to be searched for and matches the data to be searched for with previously stored data; an encoder unit that receives and encodes the memory address of the matched data; and a decoder unit that receives and decodes the encoded memory address and accesses a predetermined word of the memory unit on the basis of the decoded memory address, and the encoder unit and the decoder unit are positioned adjacent to each other on a first side of the memory unit. Consequently, it is possible to connect with a shortened distance the memory address signal lines which are output from the encoder unit and input into the decoder unit to reduce the delay time caused by the wiring, thereby making it possible to improve the operational speed of the circuitry.

11 Claims, 3 Drawing Sheets

INTEGRATED CIRCUIT FOR CONTENT ADDRESSABLE MEMORY

This is a continuation of application Ser. No. 08/555,840 filed Nov. 13, 1955 now abandoned.

BACKGROUND OF THE INVENTION

1. Field of Invention

The invention relates to a content addressable memory (CAM) semiconductor integrated circuit that matches data that is stored with data that is searched. In particular, the invention relates to a semiconductor integrated circuit that shortens the physical wiring distance of a memory address signal and reduces the delay time caused by the wiring.

2. Description of Related Art

A CAM stores data in memory beforehand related to a particular field, such as a language dictionary, a directory of names or a sports almanac. The matching of data with data that has been recorded (hereafter called recorded data) is conducted in a single cycle by inputting the data that is to be searched into the memory. The memory is a device which can output whether or not data which matches the search data exists, the memory address where this data is stored and the data that is stored at this memory address. For example, for a language dictionary, when the word "semiconductor" is given as the search data, the recorded data is automatically searched, and output data is obtained such as the "semiconductor: a material having an electrical conductivity between that of a conductor and that of an insulator," which is desired.

FIG. 5 is a black diagram of one type of conventional CAM which is disclosed in Japanese Laid-Open Patent Publication Hei 6-12882. This CAM 46 comprises a search register 48, a memory unit 50, a decoder unit 56, an encoder unit 60 and an output register 62. The search register 48 latches and holds search data that is input. The memory unit 50 has bit columns arranged in the horizontal direction and word rows arranged in the vertical direction, and conducts matching of the search data that is held in the search register 48 and the recorded data. The decoder unit 56 decodes memory address signals 52a that are input, and outputs a word signal for each word memory of the memory unit 50 via the word Lines 54. The encoder unit 60 encodes the memory address where data is recorded that matches the search data in accordance with the state of the match signals output from the memory unit 50 via the match lines 58, and outputs encoded memory address signals 52b. The output register 62 holds the data that is output from the memory unit 50 on the basis of the memory address signals 52a which are input into the decoder unit 56.

In the above-described CAM 46, first search data is input into the search register 48 and is latched and held. Next, the search data which is held and output from the search register 48 is input into the memory unit 50. In the memory unit 50, all bits or specific bits of the search data and recorded data of the word memories of the memory unit 50 are searched for matches simultaneously in a single cycle, and when a match or the lack of a match is detected, a match signal is output. Following this the match signals which are output to each word memory of the memory unit 50 are input into the encoder unit 60 via match lines 58. The encoder unit 60 encodes the memory address corresponding to the match line 58 of highest priority, from out of the match lines 58 to which match signals are output for which matches have been detected, is encoded, and a memory address signal 52b is output. Following this, the memory address signal 52b output from the encoder unit 60 is input into the decoder unit 56. In the decoder unit 56, this memory address signal 52b is decoded and a word signal corresponding to the memory address is output. Next, the word signal output from the decoder unit 56 is input into the memory unit 50 via the word lines 54. In the memory unit, data is output from the word memory corresponding to the word line 54 from which the active word signal is output. The data output from the memory unit 50 is then input into the output register 62, is latched and held, and is output from the output register 62.

This kind of CAM is one wherein the search data and recorded data are matched in the memory unit; and in the encoder unit, a memory address signal for the memory address where the data which matches the search data is recorded is output. The memory address signal is then input into the decoder unit as necessary, and data corresponding to this memory address is output.

FIG. 6 is a block diagram of one example of the layout of the above-described example of a conventional CAM. The CAM 64 shown in this drawing comprises a memory unit 12,, a decoder unit 32, and an encoder unit 34. The memory unit 12 has bit columns arranged in the horizontal direction and word rows arranged in the vertical direction. The decoder unit 32 is positioned to the left side of the memory unit 12, and supplies word signals to the memory unit 12 via word lines 14. The encoder unit 34 is positioned to the right side of the memory unit 12, and receives match signals from the memory unit 12 via match lines 18. In FIG. 6, the region surrounded by the dotted line is a region showing one word memory. In addition, the decoder 32 and the encoder 34 are shown illustratively using an invertor and not a concrete integrated circuit.

In the conventional type of CAM 64 arranged as shown in FIG. 6, word lines 14 are used as the interface signals between the decoder unit 32 and the memory unit 12. In addition, match lines 18 are used as the interface signals between the encoder unit 34 and the memory unit 12. Consequently, the memory unit 12 is interposed between the decoder unit 32 and the encoder unit 34. Accordingly, as the layout area of the memory unit 12 becomes larger, accompanying increases in the memory capacity, specifically as the horizontal width (bit column width) of the memory unit 12 becomes wider, the physical distance between the decoder unit 32 and the encoder unit 34 becomes greater. As described above, the memory address signal output from the encoder unit 34 is input into the decoder unit 32 as necessary and is used to read the data that is recorded at this memory address. in a conventional type of CAM 64, the wiring distance of the memory address signal from the encoder unit 34 to the decoder unit 32 becomes longer, creating the problem that the delay caused by the wiring is large. For example, when a process is conducted which outputs the memory address signal from the encoder unit 34 and reads data that is recorded at this memory address, a delay is created in the time needed for the memory address signal to be input into the decoder unit 32. Specifically, when the horizontal width of the memory unit is 5–6 mm, the delay time of the memory address signal caused by the wiring reaches 2–3 ns, and in the worst cases, cannot be contained within the reading cycle.

SUMMARY OF THE INVENTION

In consideration of the above problems which are based on the above-described related art, it is an objective of the present invention to provide a semiconductor integrated circuit which directs the memory address signals output from the encoder unit and input into the decoder unit over a short wiring distance and thereby reduces the delay time caused by the wiring. As a means thereof, the decoder unit and the encoder unit are tiered and wiring passes through the encoder or decoder units or in a neighborhood thereof. The short wiring distance is provided by locating both the decoder unit and the encoder unit adjacent to one side of the memory unit.

In order to achieve the above and other objectives, the present invention provides a semiconductor integrated circuit, of the type which has a memory unit which matches data that is to be searched and data that is stored beforehand; an encoder unit which outputs the memory address of the data that is matched by the memory unit; and a decoder unit which accesses a predetermined word of the memory unit on the basis of the memory address which is input; wherein the encoder unit and the decoder unit are positioned adjacent to each other on one side of the memory unit.

The semiconductor integrated circuit is preferably one wherein the memory unit comprises at least two memory blocks having bit columns arranged in a first direction and word rows arranged in a second direction substantially orthogonal to the first direction; the encoder unit being tiered into a main encoder unit and a sub-encoder unit; and the decoder unit being tiered into a main decoder unit and a sub-decoder unit.

In addition, the semiconductor integrated circuit is preferably one wherein both the main encoder unit and the main decoder unit are positioned adjacent to one side of the memory unit in the direction of the bit columns, and interface signal lines between the memory unit and one of the encoder unit and the decoder passes through another one of the encoder unit and the decoder unit or in a neighborhood thereof to the memory unit.

The semiconductor integrated circuit is preferably one wherein both the sub-encoder unit and the sub-decoder unit are positioned on one side of the memory unit in the direction of the word rows.

In addition, the semiconductor integrated circuit may include a selector circuit which selects and outputs either memory addresses which have been output from the main encoder unit and the sub-encoder unit or memory address which are input from an external unit, and inputs the selected memory addresses into one of the main decoder unit and the sub-decoder unit.

DESCRIPTION OF THE DRAWING

The invention is described with reference to the following drawings, in which like reference numerals refer to like elements and wherein.

DESCRIPTION OF THE PREFERRED EMBODIMENT

The semiconductor integrated circuit of the present invention is a CAM which includes an encoder unit and a decoder unit that are arranged on one side of a memory unit in a bit column direction. By arranging the encoder unit and decoder unit on one side of the memory unit, the physical wiring distance over which memory address signals output from the encoder unit and input into the decoder unit must pass is shortened. For example, when the decoder unit is positioned on a right side of the memory unit and the encoder unit is positioned on the right side of the decoder unit, it would be possible to connect the interface signal lines (word lines) between the memory. unit and the decoder unit in the same way as in conventional devices, but the interface signal lines (match lanes) between the memory unit and the encoder unit are blocked by the decoder unit, and hence must be diverted. Consequently, in the semiconductor integrated circuit of the present invention, the decoder unit is tiered into a main decoder unit and a sub-decoder unit. In addition, the encoder unit is tiered into a main encoder unit and a sub-encoder unit, and the number of gates for the main decoder unit and the main encoder unit arranged on one side of the memory unit in the bit column direction is reduced. Consequently, it is possible to lower the density of the layout area, and to cause interface lines from the memory unit which are input into the encoder unit to pass through the decoder unit or through a neighborhood thereof. Accordingly, in is possible to connect the word lines and the match lines with substantially the same wiring distance as in the conventional devices, and it is possible to connect with the shortest possible distance the memory address signal lines which are input into the decoder unit from the encoder unit. As a result, with the semiconductor integrated circuit of the present invention, it is possible to shorten the wiring distance of the memory address signal lines which are output from the encoder unit and input into the decoder unit, and to reduce the delay time caused by the wiring, thereby making it possible to improve the operation speed of the circuitry.

Hereafter, the semiconductor integrated circuit of the present invention will be described in detail on the basis of the preferred embodiments shown in the attached drawings.

Figure 1:
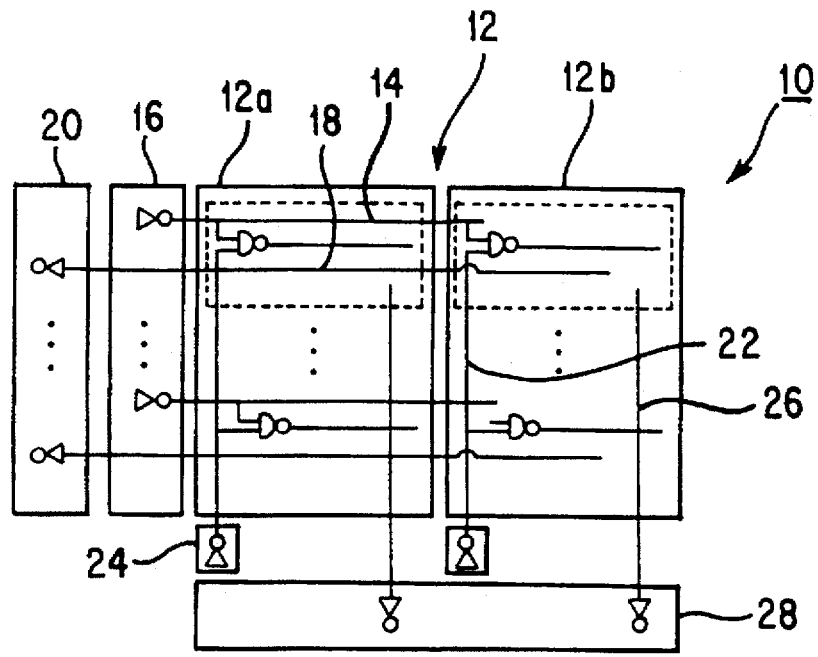
FIG. 1 is a block diagram of a preferred semiconductor integrated circuit layout of the present invention.

FIG. 1 is a block diagram of an embodiment of the layout of the semiconductor integrated circuit of the present invention. The semiconductor integrated circuit 10 shown in FIG. 1 comprises a memory unit 12, a main decoder unit 16, a main encoder unit 20, a sub-decoder unit 24 and a sub-encoder unit 28, The memory unit 12 is provided with two memory blocks 12a and 12b is columns arranged in the horizontal direction and word rows arranged in the vertical direction. The memory blocks 12a and 12b are arranged side-by-side in the bit column direction. The main decoder unit 16 is positioned to the left side (as shown in FIG. 1) of the memory unit 12, and supplies word signals to the memory unit 12 via word lines 14. The main encoder unit 20 is positioned to the left side of the main decoder unit 16, and receives match signals from the memory unit 12 via match lines 18. The sub-decoder unit 24 is positioned below the main encoder unit 20 and the memory unit 12, and supplies block signals to the memory unit via block lines 22. The sub-encoder unit 28 is positioned below the sub-decoder unit 24, and receives match signals from the memory unit 12 via match lines 26. In FIG. 1, the various components are represented using invertors and NAND gates for illustrative purposes only and in actuality may be specific integrated circuits.

The memory unit 12 has two memory blocks 12a and 12b. The memory blocks 12a and 2b are CAMs having bit columns arranged in the horizontal direction with for example 32 bits per word, and word rows arranged in the vertical row with for example 128 word rows. The memory unit 12 searches for matches between search data and recorded data and match signals are output from the word memory where data that matches the search data is recorded. The match signals output from the word memories are input into the above-described main encoder unit 20 and sub-encoder unit 28 via match lines 18 and 26, respectively.

The main decoder unit 16 decodes memory address signals that are input, and supplies word signals to the memory unit 12 via word lines 4. The word signals are signals that are supplied in common to the same word memories of all of memory blocks 12a and 2b, and which access the word memory designated by the memory address signal.

The sub-decoder unit 24 supplies block signals to the memory unit 12 via block lines 22. The block signals are signals that are supplied in common to all of the word memories in each of the memory blocks 12a and 12b, and which access the memory blocks designated by the memory address signal.

Using these word signals and block signals, logic is detected in each of the word memories, and word memories where both the word signal and the block signal are active are accessed.

In addition, the main encoder unit 20 and the sub-encoder unit 28 encode memory addresses that have matched the search and output these as memory address signals on the basis of match signals output from the memory unit 12. These memory address signals are input into an external unit or again into the main decoder unit 16 and the sub-decoder unit 24 as necessary. Normally, the low order memory addresses are encoded in the main encoder unit 20 and the high order memory addresses are encoded in the sub-encoder unit 28. Naturally, this may be reversed, and it is also fine to configure the circuit so that arbitrary bits of the memory address are encoded by each.

In the above-described semiconductor integrated circuit, when search data is input into the memory unit 12, all of the bits thereof or specific bits thereof are matched simultaneously in a single cycle in the memory unit 12 with encoded data of the word memories of the memory unit 12. As a result, a match or the lack of a match is detected, and match signals are output from the word memories that matched.

Then the match signals are input into the main encoder unit 20 and the sub-encoder unit 28 via the match lines 18 and 26, and the memory addresses are encoded and output as memory address signals. When there are a plurality of word memories that match, the memory addresses are encoded and output in the order of highest priority.

The memory address signals are then output from the main encoder unit 20 and the sub-encoder unit 28 and are input into an external unit or into the main decoder unit 16 and the sub-decoder unit 24 (by wiring connections not shown) as necessary, and are decoded, and word signals and block signals corresponding to the memory address signals are supplied to the memory unit 12 via the word lines 14 and the block lines 22.

The word memories for which active word signals and block signals are supplied are then accessed in the memory unit 12, and the recorded data is output to an output device (not shown in FIG. 1).

In the semiconductor integrated circuit 10 of the present invention shown in FIG. 1, the memory unit 12 is divided into two memory blocks 2a and 2b. The decoder unit is tiered into a main decoder unit 16 and a sub-decoder unit 24. The encoder unit is tiered into a main encoder unit 20 and a sub-encoder unit 28. Therefore, the number of gates (the number of transistors) in the main decoder unit 16 and the main encoder unit 20 are reduced, and the density of the layout area is reduced. Consequently, the match lines 18 may pass through the main decoder 18 or in a neighborhood thereof. Accordingly, it is possible to position the main decoder unit 16 and the main encoder unit 20, and the sub-decoder unit 24 and the sub-encoder unit 28, so that each pair is on the same side of the memory unit 12. This allows connection of the wiring from the main and sub encoder units to the main sub decoder units, respectively with a shorter distance than convention devices. Naturally, the length of the word lines that are supplied to the memory unit 12 from the main decoder unit 16, and the length of the match lines that are input into the main encoder unit 20 from the memory unit 12, are substantially the same as in the conventional model.

The semiconductor integrated circuit of the present invention is not limited to the above-described embodiment, for it does not matter into how many blocks the memory unit is divided, for example. In addition, the decoder unit and the encoder unit may be positioned in other ways as long as the main decoder unit and the main encoder unit are positioned adjacent to each other, and preferably the sub-decoder unit and the sub-encoder unit are also positioned adjacent to each other. For example, it would be fine to position the main encoder unit to the left side of the memory unit and to position the main decoder unit to the left side of the main encoder unit. Similarly, it would be fine to position the main decoder unit to the right side of the memory unit and to position the main encoder unit to the right side of the main decoder unit. It would also be fine to position the main encoder unit to the right side of the memory unit and to position the main decoder unit to the right side of the main encoder unit. It is possible to appropriately alter the positioning of the sub-decoder unit and the sub-encoder unit in an entirely analogous way.

Figure 3:
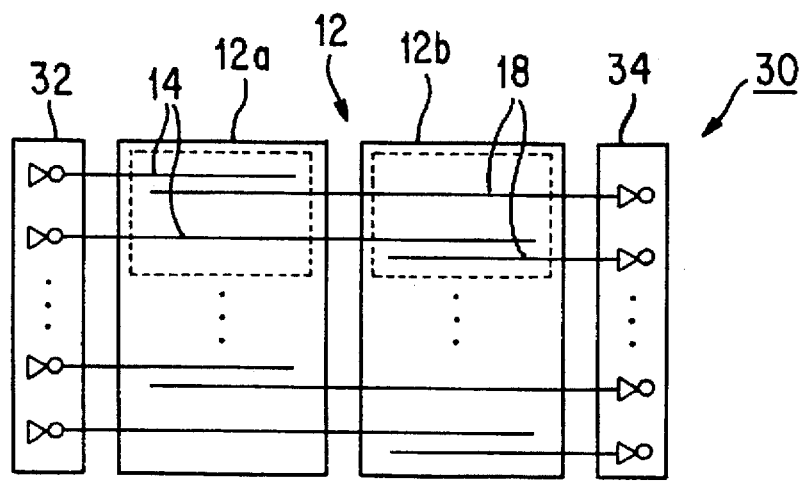
FIG. 3 is a block diagram of a semiconductor integrated circuit layout with a memory unit divided in two.
Figure 4:
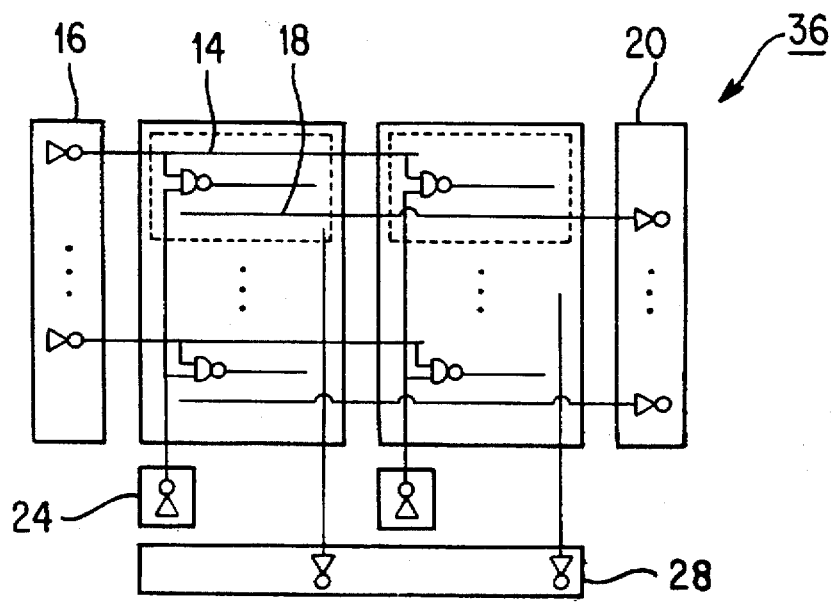
FIG. 4 is a block diagram of a semiconductor integrated circuit layout with the memory unit divided in two and with the decoder unit and encoder unit tiered.
Figure 5:
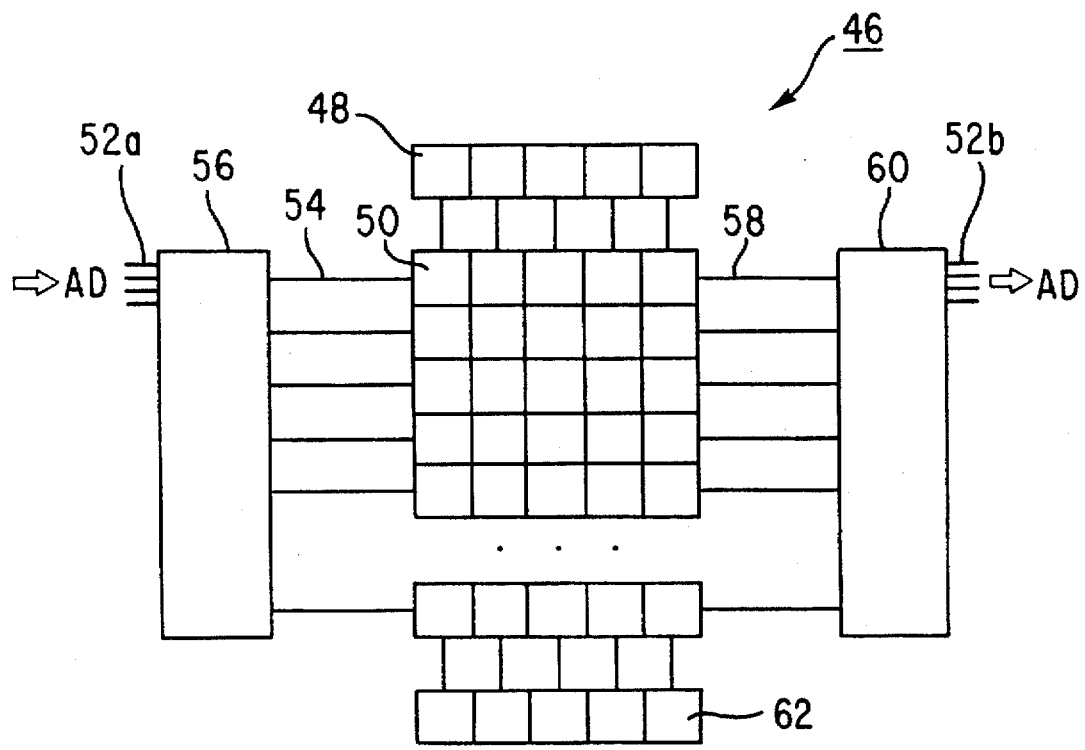
FIG. 5 is a block diagram of a conventional CAM.
Figure 6:
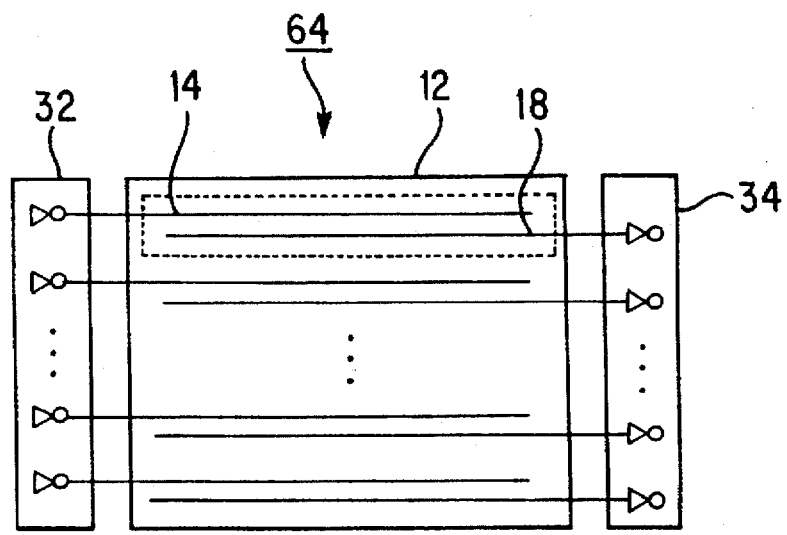
FIG. 6 is a block diagram of a conventional CAM layout.

The reasons it is possible to reduce the number of gates and to lower the density of the layout area by tiering the decoder unit in a main decoder unit 16 and a sub-decoder unit 24 and tiering the encoder unit in a main encoder unit 20 and a sub-encoder unit 28 are explained hereafter with reference to FIGS. 3 and 4.

FIG. 3 is a block diagram of the layout of a semiconductor integrated circuit 30 in which the memory unit 12 is divided into two memory blocks 12a and 12b, the decoder unit 32 is positioned to the left side of the memory unit 12 and the encoder unit 34 is positioned to the right side of the memory unit 12. The regions surrounded by the dotted lines are the regions that indicate one word memory in each of the memory blocks 12a and 12b. In the semiconductor integrated circuit 30 shown in FIG. 3, the decoder unit 32 is not tiered, so it is necessary to supply separate word signals from the decoder unit 32 to each of the word memories in the memory blocks 12a and 12b. Consequently, not only are two circuits needed to decode the word signals in the regions of the decoder unit 32 which correspond to one word memory of the memory unit 12, it is also necessary to cause two word lines 14 to pass into the memory unit 12. In addition, a similar state occurs in the encoder unit 34, and when the memory unit 12 is further divided into a plurality of memory blocks, it is necessary to provide and wire circuits and wiring matching the number of memory blocks in the regions corresponding to one word memory of the memory unit 12. In this way, when the decoder unit 32 and encoder unit 34 are not tiered, the number of gates in the decoder unit 32 and encoder unit 34 increases on both sides of the memory unit 12, causing the density of the layout area of the decoder unit 32 and the encoder unit 34 to increase.

In contrast to this, the semiconductor integrated circuit shown in FIG. 4 is similar to the semiconductor integrated circuit 30 shown in FIG. 3 except that the decoder unit 32 and the encoder unit 34 have been tiered. The main decoder unit 16 is positioned to the left side of the memory unit 12, the main encoder unit 20 is positioned to the right side of the memory unit 12, and additionally a sub-decoder unit 24 is positioned below the memory unit 12 and a sub-encoder unit 28 is positioned below the sub-decoder unit. The areas surrounded by the dotted lines are regions indicating one word memory of each of the memory blocks. In the semiconductor integrated circuit 36 shown in this FIG. 4, the decoder unit is tiered in a main decoder unit 16 and a sub-decoder unit 24, and because of this, it is fine to supply only one block signal from the sub-decoder unit 24 to each of the memory blocks 12a and 12b and to supply only one word signal from the main decoder unit 16 in common to each of the memory blocks 12a and 12b. Consequently, it is fine to prepare one circuit for decoding the common word signal in each of the memory blocks 12a and 12b in the regions of the main decoder unit 16 corresponding to one word memory in the memory unit. It is fine to cause one word line 14 to pass into the memory unit 12 also. In addition, the situation is the same in the main encoder unit as in the main decoder unit. In this way, when the decoder unit and the encoder unit are tiered, it is possible to reduce the number of gates in the main encoder unit 20 and the main decoder unit 16 which are positioned on both sides of the memory unit 12. In addition, it is possible to lower the density of the layout area of the main decoder unit 16 and the main encoder unit 20, and consequently, it is possible to cause the match lines 18 or the word lines 14 to pass through the main decoder unit 16 or the main encoder unit 20 or a neighborhood thereof even when the main decoder unit 16 and the main encoder unit 20 are positioned adjacent to the same side of the memory unit in the bit column direction.

Next, the semiconductor integrated circuit of the present invention will be described more specifically using the embodiment shown in FIG. 2.

Figure 2:
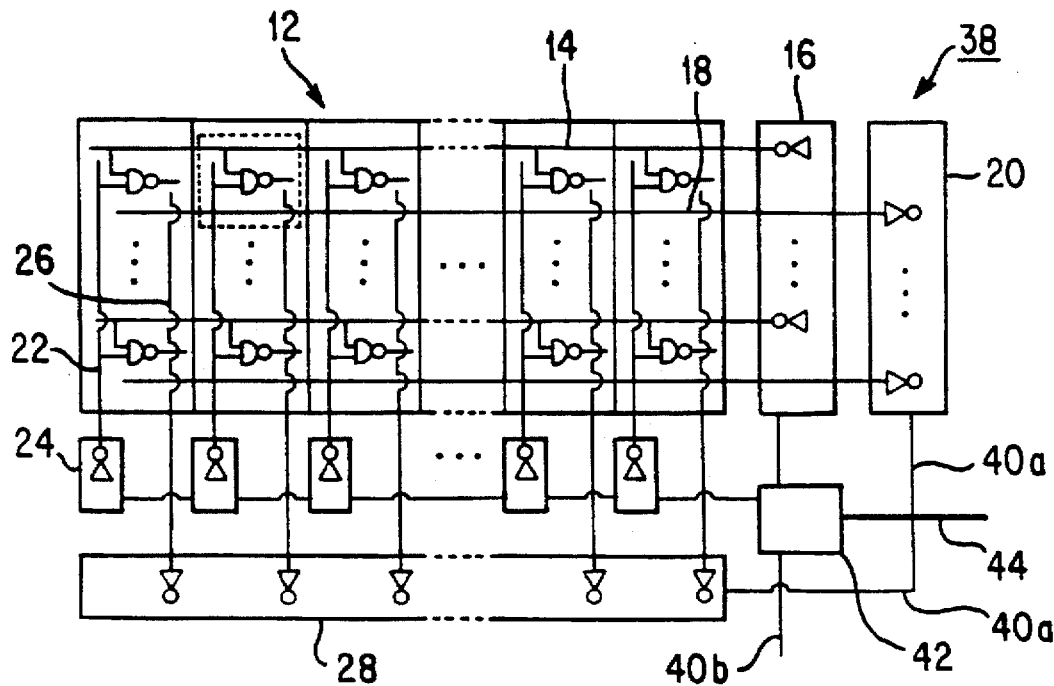
FIG. 2 is a block diagram of another preferred semiconductor integrated circuit layout of the present invention.

FIG. 2 is a block diagram of another preferred embodiment of the layout of the semiconductor integrated circuit of the present invention. The semiconductor integrated circuit 38 shown in the figure comprises a memory unit 12, a main decoder unit 16, a main encoder unit 20, a sub-decoder unit 24, a sub-encoder unit 28 and a selector circuit 42. The memory unit 12 is provided with a plurality of memory blocks having bit columns arranged in the horizontal direction and word rows arranged in the vertical direction. The memory blocks are arranged side-by-side in the bin column direction. The main decoder unit 16 is positioned to the right side of the memory unit 12 (as shown in FIG. 2), and supplies word signals to the memory unit 12 via word lines 14. The main encoder unit 20 is positioned farther to the right side of the main decoder unit 16, and receives match signals from the memory unit via match lines 18. The sub-decoder unit 24 is positioned below the memory blocks of the memory unit 12, and supplies block signals to the memory unit 12 via block lines 22. The sub-encoder unit 28 is provided below the sub-decoder unit 24, and receives match signals from the memory unit 12 via match lines 26. The selector circuit 42 selects either the memory address signal 40a output from the main encoder unit 20 and the sub-encoder unit 28, or the memory address signal 40b output from an external unit, outputs the selected memory address signal, and inputs this into the main decoder unit 16 and the sub-decoder unit 24. In FIG. 2, the various components are represented using invertors and NAND gates for illustration purposes, but may include specific integrated circuits.

The semiconductor integrated circuit 38 shown in FIG. 2 is similar to the semiconductor integrated circuit 10 shown in FIG. 1 with the exceptions that the memory unit 12 is divided into a plurality of memory blocks, both the main decoder unit 16 and the main encoder unit 20 are positioned adjacent to the right side of the memory unit 12, and a selector circuit 42 is provided, and hence the same symbols are used for elements having the same structure, and redundant description of these is omitted.

In the semiconductor integrated circuit 38, the memory address signals 40a output from the main encoder unit 20 and from the sub-encoder unit 28 are output to an external unit (not shown) of the semiconductor integrated circuit 38 via an address bus 44 and are also input into the selector circuit 42. In addition, memory address signals 40b which are input from the external unit of the semiconductor integrated circuit 38 are also input into the selector circuit 42. One of these memory signals 40a and 40b which are input into the selector circuit 42 is selected and output by a selection signal which is output from a control circuit (not shown) and input into the selector circuit 42, and the selected signal is input into the main decoder unit 16 and the sub-decoder unit 24.

Thus, by appropriately selecting and outputting to the main decoder unit 16 and the sub-decoder unit 24 the memory address signals 40a and 40b which are input into the selector circuit 42, it is possible to read data that has been stored in an arbitrary word memory in the memory unit 12 using the memory address signals 40b input from the external unit. In addition, it is possible to read the data which has been stored in a word memory that is matched in the memory unit 12 using the memory address signals 40a input from the main encoder unit 20 and the sub-encoder unit 28. In this way, by providing a selector unit 42, it is possible to suppress the delay time in the memory address signals 40a caused by wiring and to improve the operation speed when data is read which has been stored in the word memory of the memory unit 12 that is matched, using the memory address signals 40a output from the main encoder unit 20 and the sub-encoder unit 28.

As described in detail above, the semiconductor integrated circuit of the present invention is such that the decoder unit is tiered into a main decoder unit and a sub-decoder unit, the encoder unit is tiered into a main encoder unit and a sub-encoder unit, both the main decoder unit and the main encoder unit are provided on one side of the memory unit in the bit column direction, and it is possible for the interface signal lines, that is to say the match lines or the word lines, between the memory unit and the main encoder unit or the main decoder unit which is not adjacent to the memory unit to pass through the main decoder unit or the main encoder unit which is adjacent to the memory unit, or through a neighborhood thereof.

Accordingly, with the semiconductor integrated circuit of the present invention, by tiering the decoder unit and the encoder unit, reducing the number of gates for the main decoder unit and the main encoder unit, and lowering the density of the layout area, the interface signal lines of one decoder or encoder unit may pass through the other of the decoder or encoder unit or a neighborhood thereof. Consequently, the interface signals lines between the memory unit and the decoder unit and encoder unit are connected with substantially the same wiring distance as in conventional devices even though the decoder unit and encoder unit are positioned adjacent to one side of the memory unit, and the wiring connecting the encoder unit and the decoder unit has a shorter length than conventional devices, reducing the delay time caused by the wiring, thereby boosting the operational speed of the circuits.

What is claimed is:

1. A semiconductor integrated circuit, comprising:
   a memory unit that a) receives search data b) searches for previously stored data that match the search data, and c) outputs a memory address of the data that matches the search data, the data that match the search data being matched data;
   an encoder unit that receives and encodes the memory address of the matched data; and
   a decoder unit that receives and decodes the encoded memory address and accesses a word of the memory unit based on the decoded memory address, the encoder and decoder units being grouped together into an encoder/decoder unit; and
   wires connecting the encoder/decoder unit to the memory unit, wherein a layout of the semiconductor integrated circuit positions at least a portion of the encoder unit next to at least a portion of the decoder unit, the encoder/decoder unit being positioned next to a first side of the memory unit to minimize wire lengths of wires connecting the encoder/decoder unit and the memory unit.

2. The semiconductor integrated circuit of claim 1, wherein the memory unit comprises at least two memory blocks each having bit columns arranged in a first direction and word rows arranged in a second direction orthogonal to the first direction, the encoder unit being tiered into a main encoder unit and a sub-encoder unit and the decoder unit being tiered into a main decoder unit and a sub-decoder unit.

3. The semiconductor integrated circuit of claim 2, wherein both the main encoder unit and the main decoder unit are positioned next to each other on the first side of the memory unit in a direction of the bit columns, and interface signal lines disposed between the memory unit and one of the main encoder unit and the main decoder unit pass through the other of the main encoder unit and the main decoder unit to the memory unit.

4. The semiconductor integrated circuit of claim 2, wherein both the sub-encoder unit and the sub-decoder unit are positioned on a second side of the memory unit in a direction of the word rows, the second side being different than the first side.

5. The semiconductor integrated circuit of claim 3, further comprising a selector circuit which selects and outputs either the encoded memory address output from the main encoder unit and the sub-encoder unit or a memory address which is input from an external unit, and inputs the selected memory address to one of the main decoder unit and the sub-decoder unit.

6. The semiconductor integrated circuit of claim 3, wherein both the sub-encoder unit and the sub-decoder unit are positioned on a second side of the memory unit in a direction of the word rows, the second side being different than the first side.

7. The semiconductor integrated circuit of claim 4, further comprising a selector circuit which selects and outputs either the encoded memory address output from the main encoder unit and the sub-encoder unit or a memory address which is input from an external unit, and inputs the selected memory address to one of the main decoder unit and the sub-decoder unit.

8. A semiconductor integrated circuit, comprising:
   a memory unit that a) receives search data, b) searches for previously stored data that match the search data, and c) outputs a memory address of the data that matches the search data, the data that match the search data being matched data;
   an encoder unit that receives and encodes the memory address of the matched data; and
   a decoder unit that receives and decodes the encoded memory address and accesses a word of the memory unit based on the decoded memory address, wherein a layout of the semiconductor integrated circuit positions at least a portion of the encoder unit next to at least a portion of the decoder unit, the encoder and decoder units being positioned next to a first side of the memory unit, the memory unit including at least two memory blocks each having bit columns arranged in a first direction and word rows arranged in a second direction orthogonal to the first direction, the encoder unit being tiered into a main encoder unit and a sub-encoder unit and the decoder unit being tiered into a main decoder unit and a sub-decoder unit, both the main encoder unit and the main decoder unit being positioned next to each other and next to the first side of the memory unit in a direction of the bit columns, and interface signal lines disposed between the memory unit and one of the main encoder unit and the main decoder unit passing through the other of the main encoder unit and the main decoder unit.

9. The semiconductor integrated circuit of claim 8, wherein both the sub-encoder unit and the sub-decoder unit are positioned next to a second side of the memory unit in a direction of the word rows, the second side being different than the first side.

10. A semiconductor integrated circuit, comprising:
    a memory unit that a) receives search data, b) searches for previously stored data that match the search data, and c) outputs a memory address of the data that matches the search data, the data that match the search data being matched data;
    an encoder unit that receives and encodes the memory address of the matched data; and
    a decoder unit that receives and decodes the encoded memory address and accesses a word of the memory unit based on the decoded memory address, wherein a layout of the semiconductor integrated circuit positions at least a portion of the encoder unit next to at least a portion of the decoder unit, the encoder and decoder units being positioned next to a first side of the memory unit, the memory unit including at least two memory blocks each having bit columns arranged in a first direction and word rows arranged in a second direction orthogonal to the first direction, the encoder unit being tiered into a main encoder unit and a sub-encoder unit and the decoder unit being tiered into a main decoder unit and a sub-decoder unit, both the sub-encoder unit and the sub-decoder unit being positioned next to a second side of the memory unit in a direction of the word rows, the second side being different than the first side.

11. The semiconductor integrated circuit of claim 10, further comprising a selector circuit which selects and outputs either the encoded memory address output from the main encoder unit and the sub-encoder unit or a memory address which is input from an external unit, and inputs the selected memory address to one of the main decoder unit and the sub-decoder unit.

* * * * *